US008258985B2

(12) United States Patent
Huang et al.

(10) Patent No.: US 8,258,985 B2
(45) Date of Patent: Sep. 4, 2012

(54) SCANNING CIRCUIT AND SCANNING METHOD FOR KEYBOARD

(75) Inventors: Ren-Wen Huang, Shenzhen (CN); Jun Zhang, Shenzhen (CN); Lin-Kun Ding, Shenzhen (CN); Tsung-Jen Chuang, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 336 days.

(21) Appl. No.: 12/780,946

(22) Filed: May 17, 2010

(65) Prior Publication Data

US 2011/0122001 A1    May 26, 2011

(30) Foreign Application Priority Data

Nov. 23, 2009    (CN) .......................... 2009 1 0310221

(51) Int. Cl.
*H03M 11/00* (2006.01)
(52) U.S. Cl. ............... 341/22; 341/24; 341/26; 345/168; 345/169
(58) Field of Classification Search ............... 341/122, 341/124, 126; 345/168, 169
See application file for complete search history.

(56) References Cited

U.S. PATENT DOCUMENTS

| 4,374,384 A | * | 2/1983 | Moates ................ 340/870.38 |
| 4,706,068 A | * | 11/1987 | Eberhard ................. 341/26 |
| 4,725,816 A | * | 2/1988 | Petterson ................. 341/24 |
| 5,059,975 A | * | 10/1991 | Nakatsuka ............... 341/26 |
| 5,430,443 A | * | 7/1995 | Mitchell ................. 341/22 |
| 5,677,687 A | * | 10/1997 | Valdenaire ............... 341/26 |
| 5,760,714 A | * | 6/1998 | Zimmerman ............. 341/26 |
| 6,980,135 B2 | * | 12/2005 | Chang et al. ............. 341/26 |
| 7,151,432 B2 | * | 12/2006 | Tierling ................ 340/2.28 |
| 7,161,505 B1 | * | 1/2007 | Falik et al. .............. 341/26 |
| 7,443,317 B2 | * | 10/2008 | Sakakura ................ 341/26 |
| 2007/0290889 A1 | * | 12/2007 | Wiley ................... 341/22 |

* cited by examiner

*Primary Examiner* — Linh Nguyen
(74) *Attorney, Agent, or Firm* — Altis Law Group, Inc.

(57) ABSTRACT

A scanning circuit includes n input ports K1~Kn arranged in n rows L1~Ln; and m−2 output ports W2~(m−1) arranged in m columns P1~Pm. The n rows and the m columns define a switch matrix including n*m switches. Ends of the switches in the same row are connected to one of the n input ports K1~Kn, respectively. The ends of the switches in the column P1 are connected to ground. The ends of the switches in the same column of the columns P2~P(m−1) are connected to a power supply VCC via resistors R2~R(m−1) and the m−2 output ports W2~W(m−1), respectively. The ends of the switches in the columns Pm are connected to ground via a resistor Rs and the power supply VCC via the resistors R2~R(m−1) and diodes D2~D(m−1), respectively.

11 Claims, 4 Drawing Sheets

SCANNING CIRCUIT AND SCANNING METHOD FOR KEYBOARD

BACKGROUND

1. Technical Field

The present disclosure relates to scanning circuits and scanning methods for keyboards and, particularly, to a scanning circuit with fewer ports and a scanning method thereof.

2. Description of Related Art

Referring to FIG. 1, a conventional scanning circuit 100 used in a keyboard (not shown) usually includes sixteen keys. The scanning circuit 100 includes four rows R1~R4 and four columns C1~C4, the rows and the columns form a switch matrix (not labeled) including sixteen intersections. Sixteen switches C1R1~C4R4 are set at the intersections respectively, with two contacts of each switch electrically connected to a corresponding row and a corresponding column respectively, e.g., one contact of a switch C1R1 is electrically connected to a row R1 and the other contact of the switch C1R1 is electrically connected to a column C1. Each of the sixteen switches is normally open until a key is pressed and then the corresponding switch closes. For example, when a key is pressed, a corresponding switch, such as C1R1, closes, and then the row R1 and the column C1 are electrically connected. When the key is released, the corresponding switch opens. Furthermore, four input ports P1~P4 are electrically connected to ends of the columns C1~C4 respectively, and four output ports P5~P8 are electrically connected to the rows R1~R4 respectively. A power source is electrically connected to the other end of each column via a resistor.

During scanning, voltage of each input port P1~P4 is sequentially set low. When the voltage of one of the input ports P1~P4 is set low, the voltages of rest of the input ports P1~P4 are set high. The output ports are detected to find out if any switches are closed. Therefore, pressed keys, which correspond to the switches, can be identified.

As an example, if the voltage of the input port P1 electrically connected to the column C1 is set low, the voltage of the output port P5 electrically connected to the row R1 is also low, then the switch C1R1 is determined to be closed. Consequently, a pressed key corresponding to the switch C1R1, can be determined.

In practice, the input ports and the output ports are generally provided by a single-chip microprocessor. However, providing a microprocessor with so many ports is a waste.

Therefore, it is desirable to provide a scanning circuit and a scanning method capable of using fewer ports, which can overcome the abovementioned shortcomings.

BRIEF DESCRIPTION OF THE DRAWINGS

The components in the drawing are not necessarily drawn to scale, the emphasis instead being placed upon clearly illustrating the principles of the disclosure.

DETAILED DESCRIPTION

Figure 1:
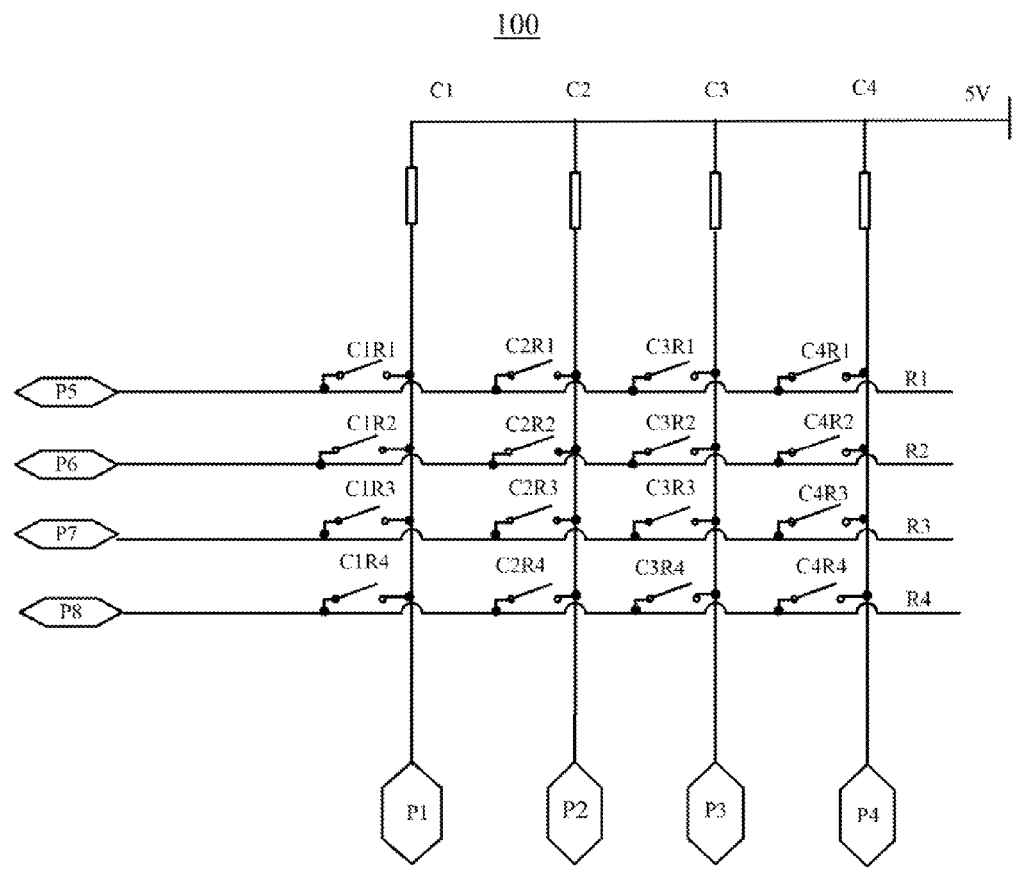
FIG. 1 is a schematic diagram showing a conventional scanning circuit.
Figure 2:
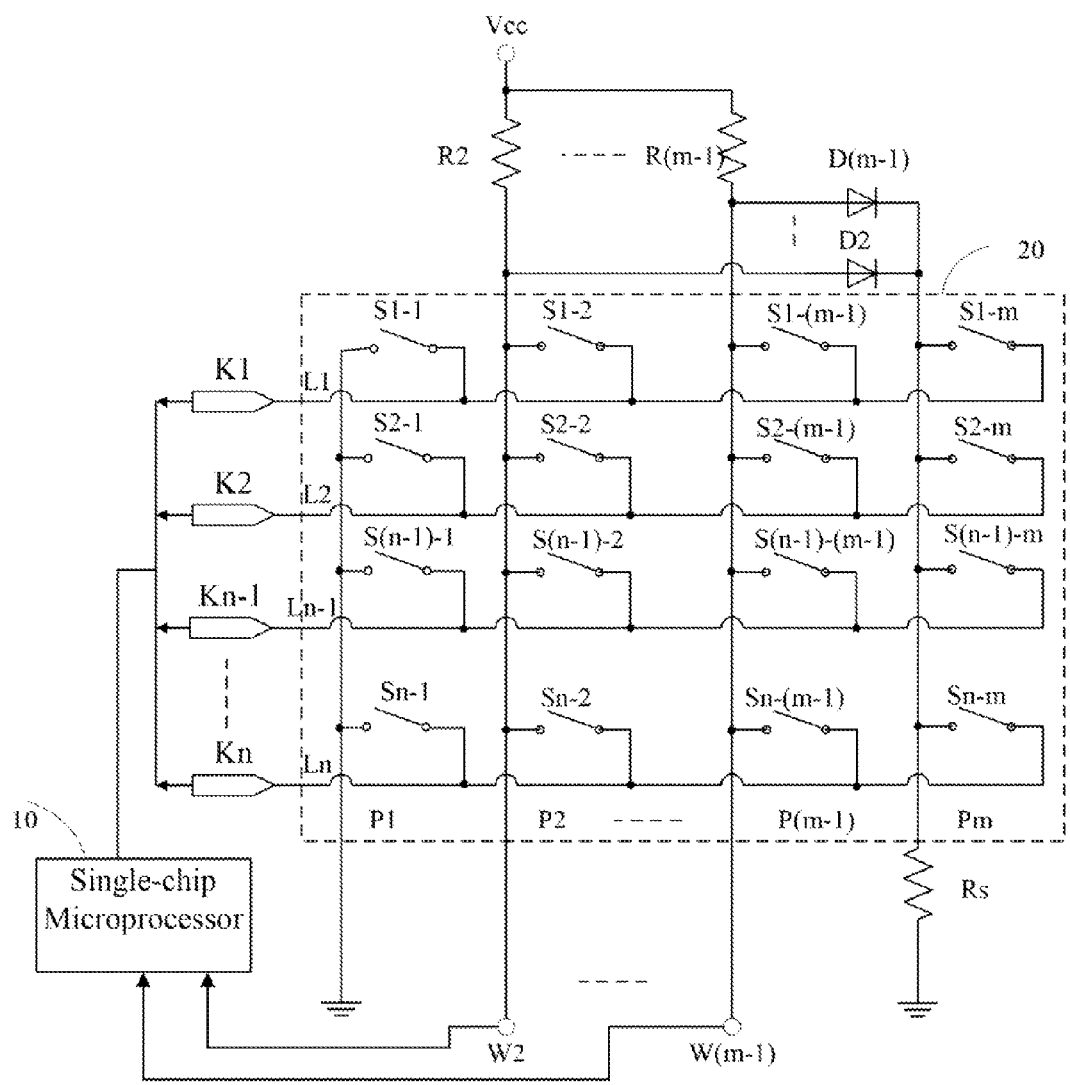
FIG. 2 is a schematic diagram of a scanning circuit in accordance with an exemplary embodiment.

Referring to FIG. 2, a scanning circuit 200 in accordance with an exemplary embodiment is illustrated. The scanning circuit 200 includes n rows L1~Ln and m columns P1~Pm. In the embodiment, n and m are natural numbers not less than three. The rows L1~Ln and the columns P1~Pm define a switch matrix 20 including n*m switches S1-1~Sn-m. An end of each of the switches in the same row is electrically connected to one of n input ports K1~Kn, respectively. The input ports K1~Kn are I/O ports of a single-chip microprocessor 10.

Regarding the columns, one end of each of the switches in column P1 is electrically connected to ground. Each of columns P2~Pm−1 includes one of resistors R2~R(m−1), respectively. The ends of the switches in the same column of the columns P2~Pm−1 are electrically connected to a power supply VCC via the resistors R2~R(m−1), respectively. Then the ends of the switches in the same column of the columns P2~Pm−1 are further electrically connected to output ports W2~W(m−1), respectively. Take the column P2 as an example, the ends of the switches in the column P2 are electrically connected to the power supply VCC via the resistor R2 and the output port W2. The output ports W2~W(m−1) are I/O ports of the single-chip microprocessor 10. The voltage of each of the output ports W2~W(m−1) is set to be low by the single-chip microprocessor 10 in sequence. The resistance of the resistors R2~Rm−1 are similar to or the same as each other.

Column Pm includes m−2 diodes D2~D(m−1) and a resistor Rs. The ends of the switches in the column Pm are electrically connected between the cathodes of the diodes D2~D(m−1) and the resistor Rs. The anodes of the m−2 diodes D2~D(m−1) are electrically connected to the power supply VCC via the m−2 resistors R2~R(m−1), respectively, and the cathodes are electrically connected to the ground via the resistor Rs. In the embodiment, the resistance of the resistor Rs is far greater than that of the resistors R2~R(m−2), so that the voltage of the resistor Rs could be identified to be high after column Pm is conducted between the power supply VCC and the ground. With such a configuration, when the voltage of one of the output ports W2~W(m−1) is set to be high, one of the diodes D2~D(m−1) corresponding to the one of the output ports W2~W(m−1) whose voltage is set to be high is thus conducted. The voltage of the ends of the switches S1-m~Sn-m in the column Pm is set to be high accordingly.

In use, the original states of the input ports K1~Kn are detected and recorded. The voltages of the output ports W2~W(m−1) are set to be high. The states of the input ports K1~Kn are re-detected. If the state of one of the input ports K1~Kn is changed, it is determined that the switch with, one end in the column P1 and the other end electrically connected to the input port whose state is changed, is pressed, and the single-chip microprocessor 10 starts a new scanning period. If the states of the input ports K1~Kn are not changed, the voltages of the output ports W3~W(m−1) are set to be high, and the voltage of the output port W2 is set to be low. The states of the input ports K1~Kn are re-detected. If the state of one of the input ports K1~Kn is changed, it is determined the switch with, one end in the column P2 and the other end electrically connected to the input port whose state is changed, is pressed, and the single-chip microprocessor 10 starts another new scanning period. If the state of the input ports are not changed, the voltage of each of the output ports W2~W(m−1) is set to be low in sequence. If the states of the input ports K1~Kn are not changed after the output port W(m−1) is set to be low, the voltages of the output ports W2~W(m−1) are set to be low simultaneously. The ends of the switches in the column Pm is detected and the states of the input ports K1~Kn are re-detected. If the state of one of the input ports K1~Kn is changed, it is determined that the switch with, one end in the column Pm and the other end electrically connected to the input port whose state is changed, is pressed. In the embodiment, the scanning circuit 200 employs n input ports and m−2 output ports to determine which of the n*m switches is pressed. Comparing to the conventional scanning circuit 100, which employs n input ports and m output ports, two output ports are saved.

Figure 3:
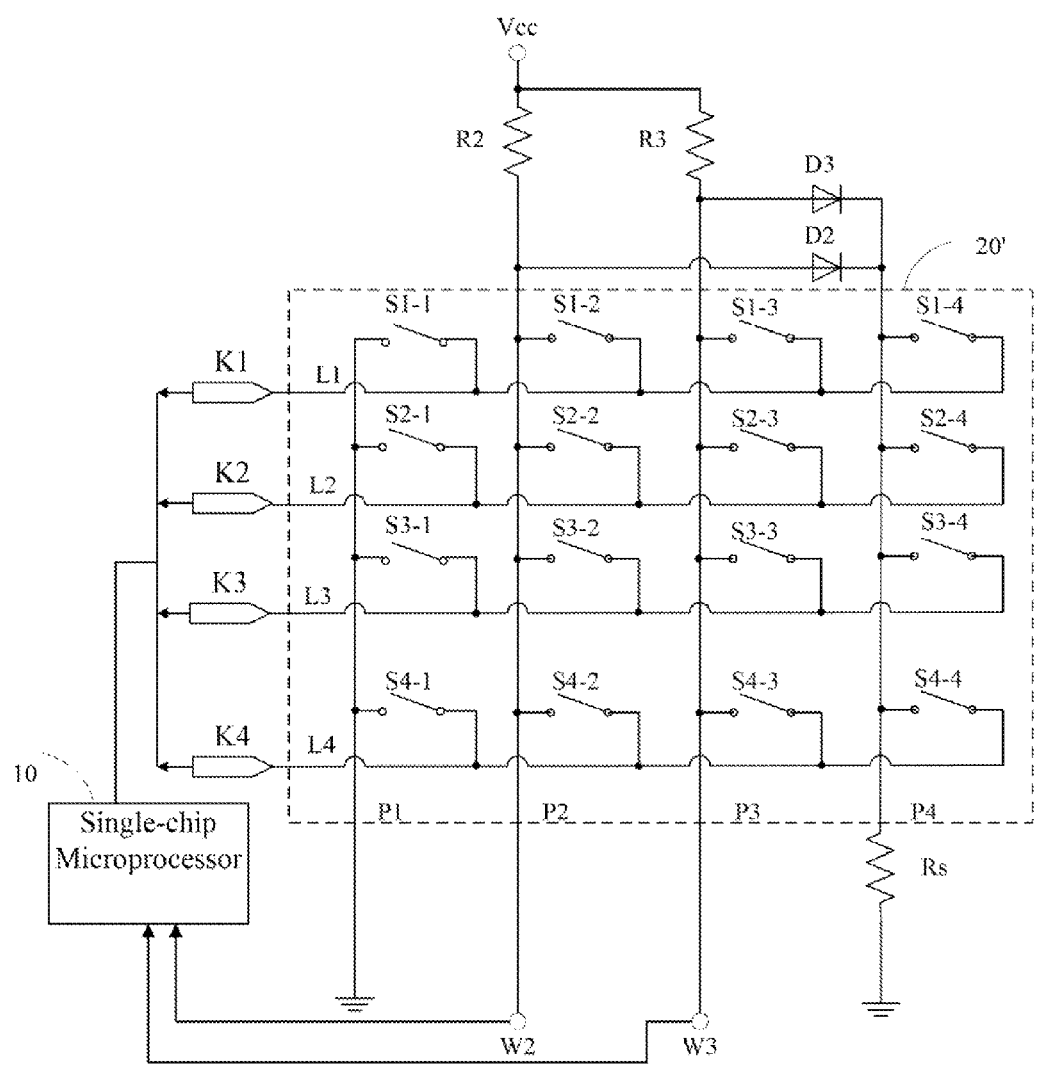
FIG. 3 is an example of the scanning circuit in FIG. 2 with four rows and four columns.

Referring also to FIG. 3, compared with FIG. 2, four input ports K1, K2, K3, and K4 and two output ports W2 and W3 are provided in the scanning circuit 201 with sixteen switches S1-1~S4-4 in a switch matrix 20'. The anode of a diode D2 is electrically connected to the resistor R2 and the cathode of the diode D2 is electrically connected to the resistor Rs. The anode of a diode D3 is electrically connected to the resistor R3 and the cathode of the diode D3 is electrically connected to the resistor Rs.

Figure 4:
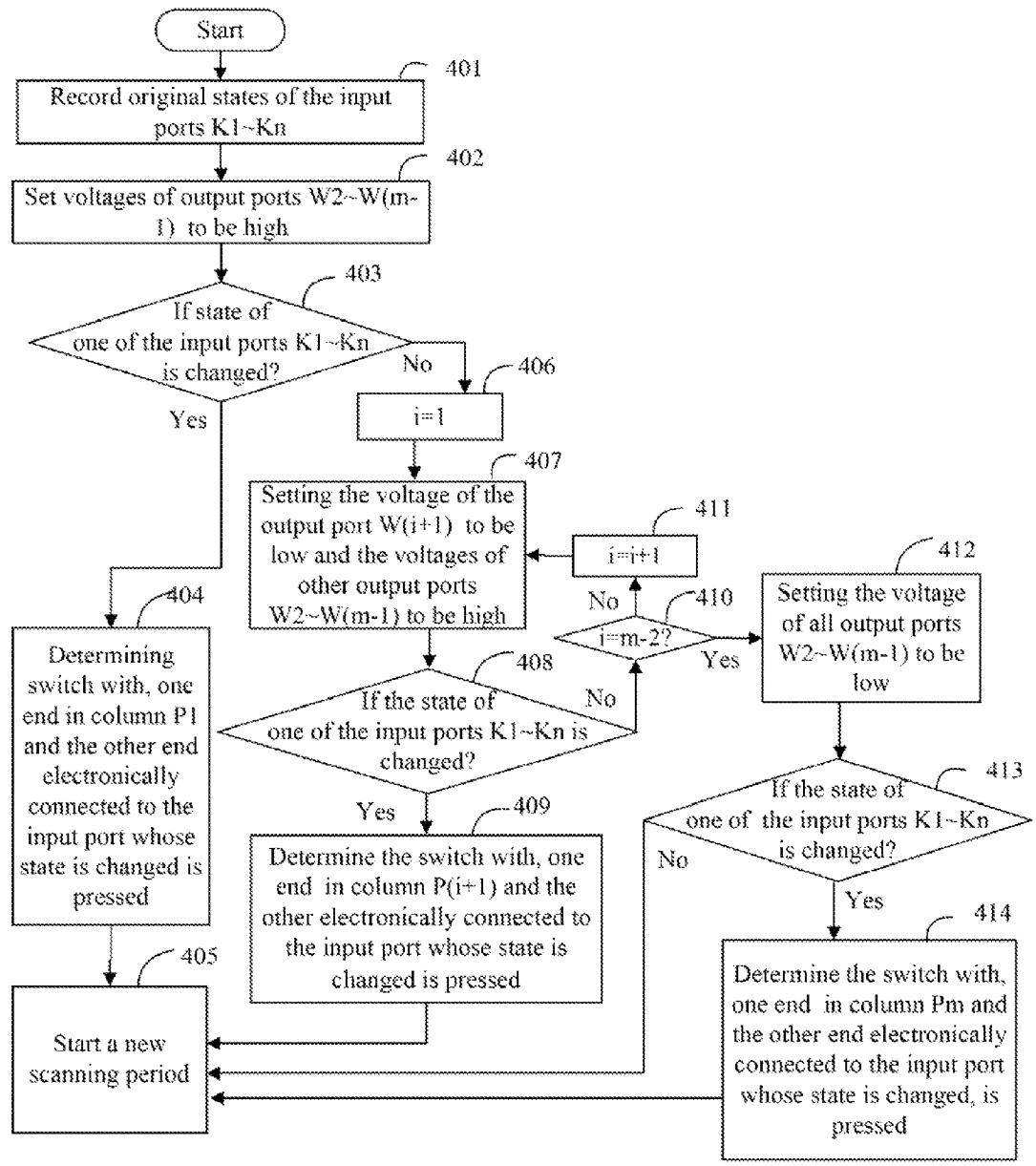
FIG. 4 is a flowchart of a scanning method implemented by the scanning circuit in FIG. 2 in accordance with an exemplary embodiment.

Referring to FIG. 4, a scanning method for scanning a keyboard to find out which keys thereof are pressed is illustrated, therein the scanning method corresponds to the scanning circuit 200 mentioned above. The procedure includes the following steps.

In Step 401, the original states of the input ports K1~Kn are detected and recorded. In Step 402, the voltages of the output ports W2~W(m−1) are set to be high. In Step 403, the states of the input ports K1~Kn are detected, the single-chip microprocessor 10 determines if the state of one of the input ports K1~Kn is changed. If no, the procedure goes to Step 406. If yes, the procedure goes to Step 404, it is determined that the switch with, one end in column P1 and the other end electrically connected to the input port whose state is changed, is pressed. In Step 405, the single-chip microprocessor 10 starts a new scanning period.

In Step 406, i=1 is set. In Step 407, the voltage of the output port W(i+1) is set to be low, and other voltages of the output ports W2~W(m−1) are set to be high. In Step 408, the states of the input ports P1~Pn are detected, the single-chip microprocessor 10 determines if the state of one of the input ports K1~Kn is changed. If yes, the procedure goes to Step 409, it is determined the switch with, one end in the column P(i+1) and the other end electrically connected to the input port whose state is changed, is pressed, then goes to Step 405. If no, the procedure goes to Step 410, the single-chip microprocessor 10 determines if i=m−2. If yes, the procedure goes to Step 412, if no, the procedure goes to Step 411. In Step 411, i=i+1 is set, and then the procedure jumps to Step 407.

In Step 412, the voltages of the output ports W2~W(m−1) are all set to be low. In Step 413, the states of the input ports P1~Pn are detected, the single-chip microprocessor 10 determines if the state of one of the input ports K1~Kn is changed. If yes, the procedure goes to Step 414, it is determined that the switch with, one end in column Pm and the other end electrically connected to the input port whose state is changed, is pressed. If no, the procedure jumps to Step 405.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being or exemplary embodiments of the present disclosure.

What is claimed is:

1. A scanning circuit used in a keyboard with a plurality of keys, the scanning circuit comprising:
   n input ports K1~Kn, arranged in n rows L1~Ln, wherein n is a natural number which is no less than 3; and
   m−2 output ports W2~W(m−1), arranged in m columns P1~Pm, wherein m is a natural number which is no less than 3;
   wherein the n rows and the m columns define a switch matrix comprising n*m switches, an ends of the switches in the same row are electrically connected to one of the n input ports K1~Kn, respectively, the ends of the switches in the column P1 are connected to ground, the ends of the switches in the same column of the columns P2~P(m−1) are electrically connected to a power supply VCC via resistors R2~R(m−1) and the m−2 output ports W2~W(m−1), respectively, the ends of the switches in the columns Pm are electrically connected to ground via a resistor Rs and the power supply VCC via the resistors R2~R(m−1) and diodes D2~D(m−1), respectively, the cathodes of the m−2 diodes D2~D(m−1) are electrically connected to the resistor Rs, and the anodes of the m−2 diodes D2~D(m−1) are electrically connected to the power supply VCC via the resistors R2~R(m−1), respectively.

2. The scanning circuit according to claim 1, wherein each one of the m columns P1~Pm is electrically connected to n switches.

3. The scanning circuit according to claim 2, wherein each one of the n row L1~Ln is electrically connected to m switches.

4. The scanning circuit according to claim 3, wherein resistances of resistors R2~R(m−2) are similar to or the same as each other.

5. The scanning circuit according to claim 3, wherein resistance of the resistor Rs is far greater than the resistance of the resistors R2~R(m−2).

6. The scanning circuit according to claim 5, wherein when one of the output ports W2~W(m−1) is set to be high, one of the diodes D2~D(m−1) corresponding to the one of the output ports W2~W(m−1) whose voltage is set to be high is thus conducted, the voltage of the ends of the switches S1-m~Sn-m in the column Pm is set to be high accordingly.

7. The scanning circuit according to claim 6, wherein the input ports K1~Kn are I/O ports of a single-chip microprocessor.

8. The scanning circuit according to claim 6, wherein the output ports W2~W(m−1) are I/O ports of a single-chip microprocessor, and the voltage of each one of the output ports W2~W(m−1) is used for being set to be low in sequence by the single-chip microprocessor.

9. A scanning method comprising the steps of:
   recording original states of the input ports K1~Kn;
   setting voltages of output ports W2~W(m−1) to be high;
   if the state of one of the input ports K1~Kn is changed, determining a switch with one end in column P1 and the other end electronically connected to the input port whose state is changed is pressed;
   if the states of the input ports K1~Kn are not changed, setting i=1;
   setting the voltage of the output port Wi+1 to be low and the voltages of other output ports W2~W(m−1) to be high;
   if the state of one of the input ports K1~Kn is changed, determining the switch with one end in column whose voltage of the output port is set to be low and the other end electronically connected to the input port whose state is changed is pressed;
   if the states of the input ports K1~Kn are not changed, determining if i=m−2;
   if i<m−2, setting i=i+1, and the step goes to step of setting the voltage of the output port W(i+1) to be low and the voltages of other output ports W2~W(m−1) to be high;

if i=m−2, setting voltages of all the output ports W2~W(m−1) to be low; and if the state of one of the input ports K1~Kn is changed, determining the switch with one end in column Pm and the other end electronically connected the input port whose state is changed is pressed.

10. The scanning method according to claim 9, further comprising a step of if none of the states of the input ports K1~Kn is changed after the voltages of all the output ports W2~W(m−1) are set to be low, the steps go from beginning.

11. The scanning method according to claim 10, further comprising a step of if one switch is determined to be pressed, the steps repeat.

* * * * *